US010020813B1

(12) United States Patent
McCauley et al.

(10) Patent No.: US 10,020,813 B1
(45) Date of Patent: Jul. 10, 2018

(54) SCALEABLE DLL CLOCKING SYSTEM

(71) Applicant: Microsoft Technology Licensing, LLC, Redmond, WA (US)

(72) Inventors: Richard McCauley, Sunnyvale, CA (US); Barry Thompson, Menlo Park, CA (US); Stefan Wurster, Livermore, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/666,391

(22) Filed: Aug. 1, 2017

Related U.S. Application Data

(60) Provisional application No. 62/444,140, filed on Jan. 9, 2017.

(51) Int. Cl.
H03L 7/06 (2006.01)
H03L 7/085 (2006.01)
G01S 7/481 (2006.01)

(52) U.S. Cl.
CPC ............ *H03L 7/085* (2013.01); *G01S 7/4811* (2013.01)

(58) Field of Classification Search
USPC .................................. 327/147–149, 156–158
See application file for complete search history.

(56) References Cited

U.S. PATENT DOCUMENTS

| 6,240,132 B1 * | 5/2001 | Yedid ................ H03H 17/0628 375/232 |
| 8,618,886 B2 | 12/2013 | Travis |
| 9,257,977 B1 * | 2/2016 | Chang .................. H03K 5/1565 |
| 9,621,022 B1 * | 4/2017 | Avitan ...................... H02M 1/08 |
| 9,865,317 B2 * | 1/2018 | Ishibashi .................. G11C 8/18 |
| 2001/0048519 A1 | 12/2001 | Bamji et al. |
| 2007/0205817 A1 * | 9/2007 | Gomm .................. H03L 7/0812 327/158 |
| 2008/0054966 A1 * | 3/2008 | Tamura ................ H03K 3/0322 327/158 |
| 2008/0297215 A1 * | 12/2008 | Ma ............................ G06F 1/12 327/158 |
| 2009/0002038 A1 * | 1/2009 | Boerstler ................ H03L 7/093 327/157 |
| 2009/0033381 A1 * | 2/2009 | Lee .......................... H03L 7/085 327/156 |
| 2010/0111241 A1 | 5/2010 | Kesterson et al. |
| 2010/0134161 A1 * | 6/2010 | Xu ........................ H03D 13/004 327/157 |
| 2011/0063004 A1 * | 3/2011 | Chen ....................... H03L 7/093 327/157 |

(Continued)

OTHER PUBLICATIONS

Jia, Cheng, "A Delay-Locked Loop for Multiple Clock Phases/Delays Generation", In Doctoral Dissertation, Dec. 2005, 94 pages.

*Primary Examiner* — Adam Houston
(74) *Attorney, Agent, or Firm* — Holzer Patel Drennan

(57) ABSTRACT

A clocking system disclosed herein includes a delay locked loop (DLL) circuit with a plurality of delay elements, where the DLL circuit is configured to receive a clock input signal and generate a plurality of clock output signals. The clocking system also includes a feed-forward system configured to increase the speed of the clock signal transmission through the delay elements and to enforce symmetric zero crossings of the clock signal at each of the plurality of delay elements.

20 Claims, 11 Drawing Sheets

(56) References Cited

U.S. PATENT DOCUMENTS

| | | | | |
|---|---|---|---|---|
| 2011/0102043 | A1* | 5/2011 | Zerbe | G06F 1/10 |
| | | | | 327/261 |
| 2011/0122710 | A1 | 5/2011 | Harrison | |
| 2011/0150071 | A1* | 6/2011 | Takatori | H03H 11/26 |
| | | | | 375/233 |
| 2012/0032703 | A1* | 2/2012 | Crespo | H03K 5/04 |
| | | | | 326/93 |
| 2012/0194238 | A1* | 8/2012 | Maneatis | H03L 7/07 |
| | | | | 327/157 |
| 2012/0249197 | A1* | 10/2012 | Rehm | H02J 17/00 |
| | | | | 327/156 |
| 2013/0147529 | A1* | 6/2013 | Ganesan | H03L 7/1803 |
| | | | | 327/156 |
| 2013/0194013 | A1* | 8/2013 | Kwak | H03L 7/08 |
| | | | | 327/158 |
| 2015/0311907 | A1* | 10/2015 | Wu | G11C 7/22 |
| | | | | 365/194 |

\* cited by examiner

SCALEABLE DLL CLOCKING SYSTEM

CROSS-REFERENCE TO RELATED APPLICATIONS

The present application claims benefit of priority to U.S. Provisional Patent Application No. 62/444,140, entitled "Clock System For Image Sensor Pixel Array" and filed on Jan. 9, 2017, which is specifically incorporated by reference for all that it discloses and teaches.

BACKGROUND

Integrated circuits (ICs) typically contain large numbers of elements that are synchronized to a system clock. Different clock distribution methods can be used to distribute the system clock across the chip to these elements. However, as the clock signal propagates through the clock distribution structure, issues such as process, voltage, and temperature (PVT) variations can impact the delay of the clock signal. In order to ensure proper synchronous behavior, the distributed clock signals may need to be aligned to the system clock. Delay locked loops (DLLs) are typically used to align the distributed clock signals to a reference clock that is running at the same frequency or an integer sub-multiple of the system clock frequency.

SUMMARY

Implementations described herein disclose a clocking system including a delay locked loop (DLL) circuit with a plurality of delay elements, where the DLL circuit is configured to receive a clock input signal and generate a plurality of clock output signals. The clocking system also includes a feed-forward system configured to increase the speed of the clock signal transmission through the delay elements and to enforce symmetric zero crossings of the clock signal at each of the plurality of delay elements.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

A further understanding of the nature and advantages of the present technology may be realized by reference to the figures, which are described in the remaining portion of the specification. In the figures, like reference numerals are used throughout several figures to refer to similar components.

DETAILED DESCRIPTIONS

Figure 1:
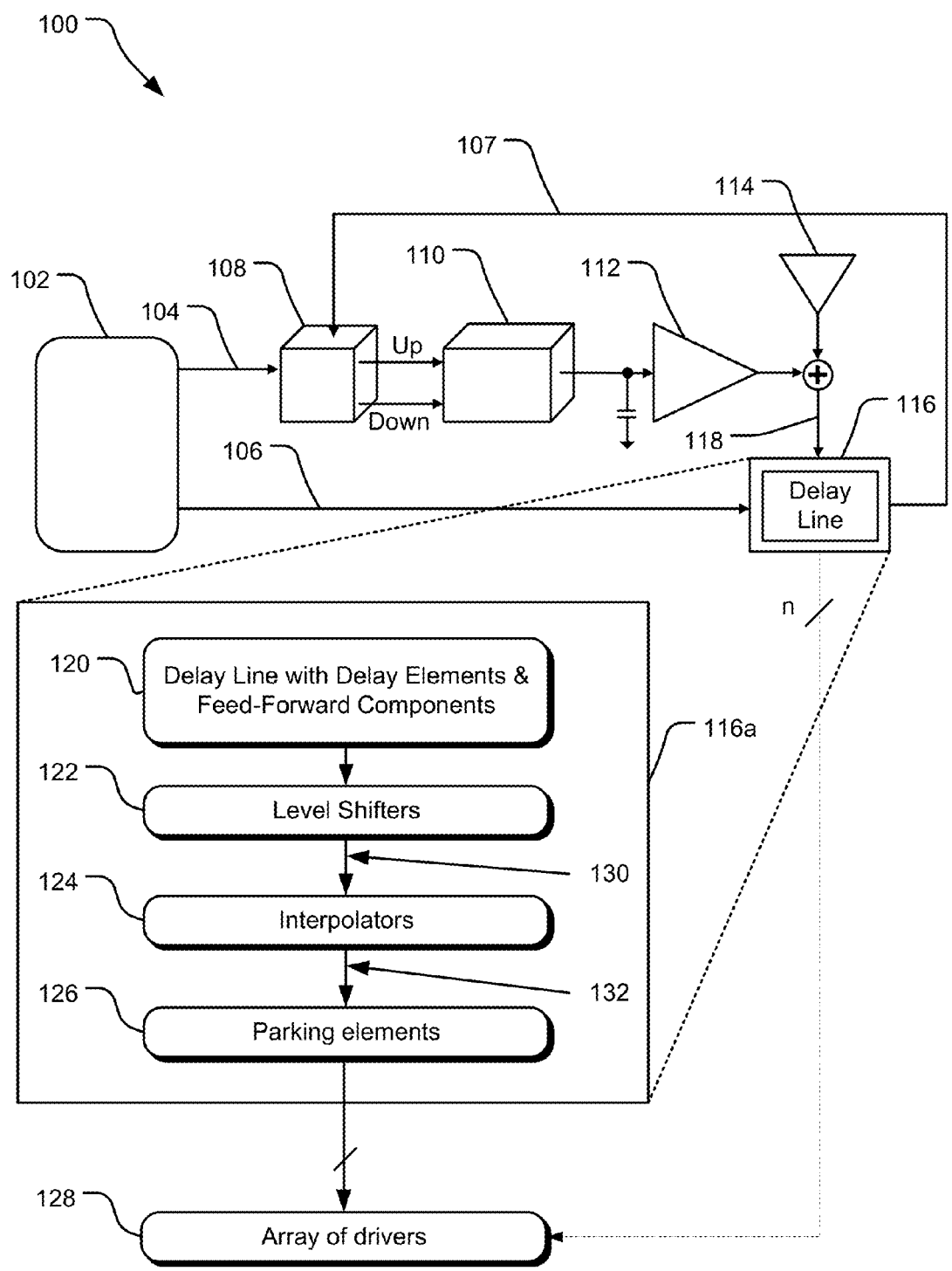
FIG. 1 illustrates an example implementation of a clocking system disclosed herein.

Aspects of this disclosure will now be described by example and with reference to the illustrated embodiments listed above. Components, process steps, and other elements that may be substantially the same in one or more embodiments are identified coordinately and are described with minimal repetition. It will be noted, however, that elements identified coordinately may also differ to some degree. It will be further noted that the drawing figures included in this disclosure are schematic and generally not drawn to scale. Rather, the various drawing scales, aspect ratios, and numbers of components shown in the figures may be purposely distorted to make certain features or relationships easier to see. In some embodiments the order of the flowchart operations may be altered, additional steps added or steps dropped.

A clocking system disclosed herein includes a delay locked loop (DLL) circuit with a plurality of delay elements, where the DLL circuit is configured to receive a clock input signal and generate a plurality of clock output signals. The clocking system also includes a feed-forward system configured to increase the speed of the clock signal transmission through the delay elements and to enforce symmetric zero crossings of the clock signal at each of the plurality of delay elements.

FIG. 1 illustrates an example implementation of a clocking system 100 disclosed herein. The clocking system 100 includes a clock waveform generator 102 that generates a clock reference signal 104 and a clock-in signal 106. The clock reference signal 104 may be a reference signal with a delay from the clock-in signal of 10 ns, for instance, period of 10 ns and it may be used as a reference signal by various other components of the clocking system 100. The clock-in signal 106 is fed to a delay line circuit 116.

In the illustrated implementation, the clock reference signal 104 is input to a phase detector 108 that works with a charge pump 110 to detect phase errors in the clock feedback signal 107. The output of the charge pump 110 is then integrated onto the loop filter capacitor and hence producing an error voltage that is converted by a voltage/current converter 112 into an error current. The error current is combined with current from a current digital-to-analog converter (DAC) 114 to generate delay element control current 118 that is used to control delay elements of the delay line circuit 116.

In one implementation, the delay line circuit 116 includes a delay line with n delay elements that generates n phases of the clock-in signal 106. In one implementation, the delay line circuit 116 generates n outputs at n secondary tap points used in one to one mapping. Specifically, each of the n secondary tap points is configured to be able to be individually enables/disabled and each secondary tap point is hardwired to a particular output. In an alternative implementation, the DLL circuit is an n-tap DLL circuit where each of the n secondary tap point may be assigned to any of M outputs.

The components of the delay line circuit 116 are further disclosed in by a block 116a. Specifically, the delay line circuit 116 includes a delay line 120 with delay elements and feed-forward components. The delay elements may be inverters implemented using transistors. Each of the delay elements of the delay line 120 produces an output waveform that is similar to the input waveform delayed by a certain amount of time. The amount of delay for each delay element is controlled by the delay element control current 118. The delay line 120 also includes various feed-forward components that are configured to increase the speed of the clock signal transmission through the delay elements and to enforce symmetric zero crossings of the clock signal at each of the plurality of delay elements.

In an implementation of the delay line 120, successive delay elements create a phase A and a phase B signal that is substantially 180 degrees out of phase. Example implementations of combinations of the delay elements and feed-forward components is disclosed in further detail in FIGS. 5 and 6 disclosed below. In one implementation, the delay line, including the delay elements and feed-forward components, operates in a low-voltage domain, resulting in significant reduction in power consumed by the delay line circuit 116. In one implementation, the delay line, including the delay elements and feed-forward components, operates in a low-voltage domain using core voltage transistors whereas the high-voltage domain uses IO voltage transistors, resulting in significant reduction in power consumed by the delay line circuit 116. However, in an alternative implementation, the whole DLL/Clock system may operate in low-voltage domain An implementation of the delay line circuit 116 also includes level shifters 122 that shifts the low voltage domain output of the delay line 120 into high voltage domain, if required, that is appropriate for use by interpolators 124. The level shifters 122 may be referred to as tap points as they allow for voltage domain separation between primary tap points 130 and secondary tap points 132. The level shifters 122 also provide reduced load access to the secondary tap points 132. However, in an alternative implementation, the delay line circuit 116 may not include the level shifters 122.

The interpolators 124 are configured to space each of the delayed clock output signals at the primary tap points 130 to generate a plurality of clock signals substantially equidistance from each other at the plurality of secondary tap points 132. Specifically, the interpolators 124 may interpolate output from each delay element on the successive A phase progression with itself, which allows to preserve equal loading. Each delay element on the successive B phase progression may be interpolated in the following way: B[n] interpolated with B[n+1] so to position the edge exactly centered in-between B[n] and B[n+1]. In one implementation, the interpolators 124 are configured so as to generate output clock signals that are at substantially 10 ps from each other the secondary tap points 132.

The interpolated output clock signals at the secondary tap points 132 are fed to parking elements 126 such as buffers. The output of the parking elements 126 may be used to drive an array of drivers 128. For example, the array of drivers 128 may be an array of pixel drivers. Alternatively, the array of drivers 128 may drive a bus multiplexer.

Figure 2:
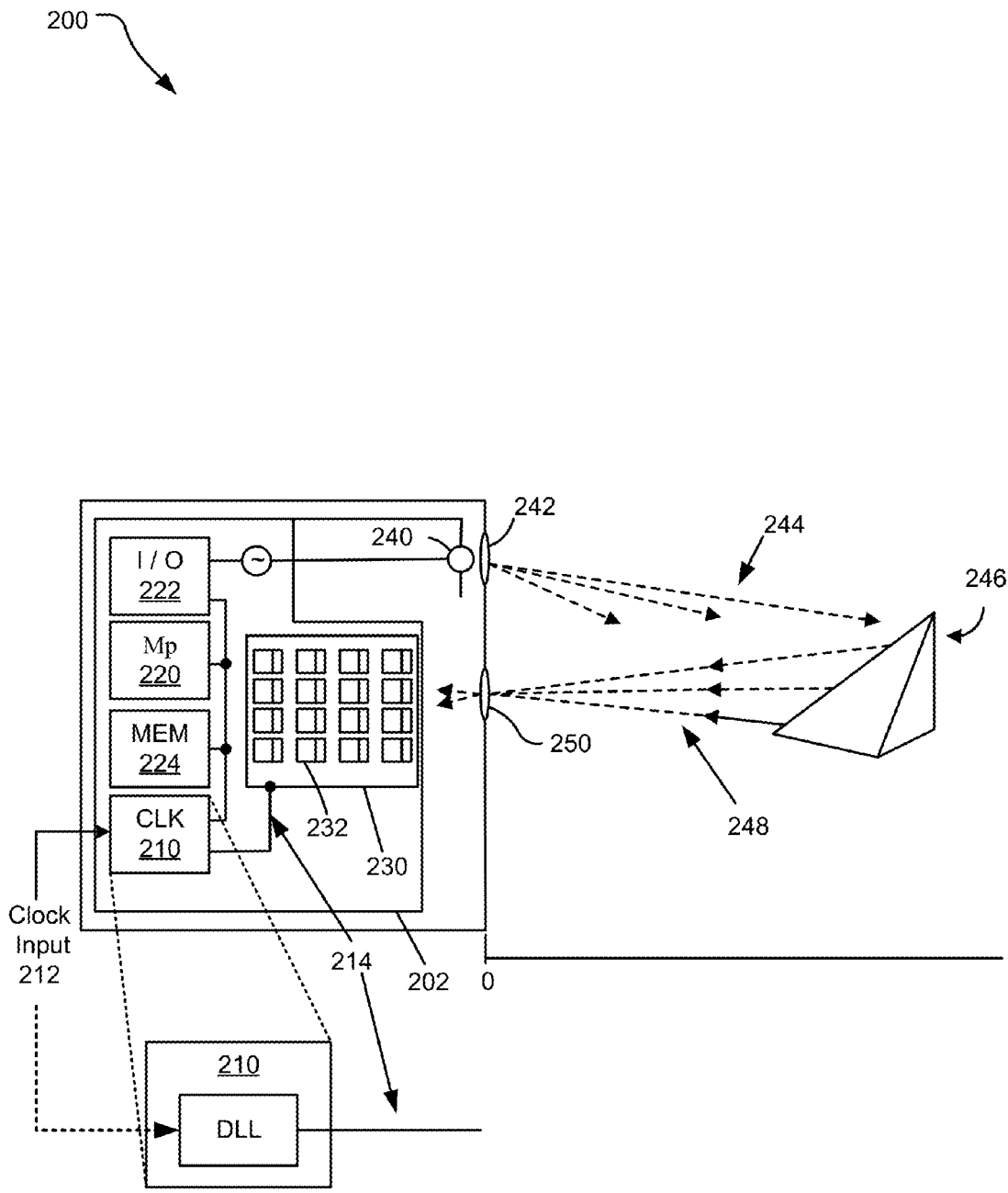
FIG. 2 illustrates an example implementation of the clocking system disclosed herein as used with a time-of-flight (ToF) system.

FIG. 2 illustrates an example use implementation of the clocking system disclosed herein as used with a time-of-flight (ToF) system 200. The ToF system 200 may be implemented on a circuit board 202. Specifically, the ToF system 200 includes a clocking system 210, a microprocessor 220, an I/O module 222, and a memory 224. A pixel array 230 including a large number of pixels 232 may be communicatively connected with the circuit board 202. The clocking system 210 receives a clock input signal 212 from a clock waveform generator and generates a plurality of clock output signals 214 that can be used to drive the drivers of the pixel array 230.

The ToF system 200 may be used to determine distance of various points on an object 246 based on the time of flight for various optical signals 244 to travel from an optical signal generator 240, such as a laser diode, to a receiving lens 250. Specifically, the I/O module 222 generates signal to be fed to the optical signal generator 240 and a focusing lens 242 may focus the signal generated by the optical signal generator 240 onto the object 246. The reflections 248 of the optical signals 244 are collected by the receiving lens 250 onto the pixels 232. The pixels drivers sample the pixels 232 based on the clock output signals 214 received from the clocking system 210.

To ensure that the pixels 232 are sampled with accurate timing, the clocking system 210 uses a DLL circuit with a delay line having a large number of delay elements and feed-forward components that enforces symmetric zero crossings of the clock signal at each of the plurality of delay elements. Furthermore, the DLL circuit may also include interpolators to space each of the delayed clock output signals at primary tap points of the DLL to generate a plurality of clock output signals substantially equidistance from each other at a plurality of secondary tap points of the DLL.

Figure 3:
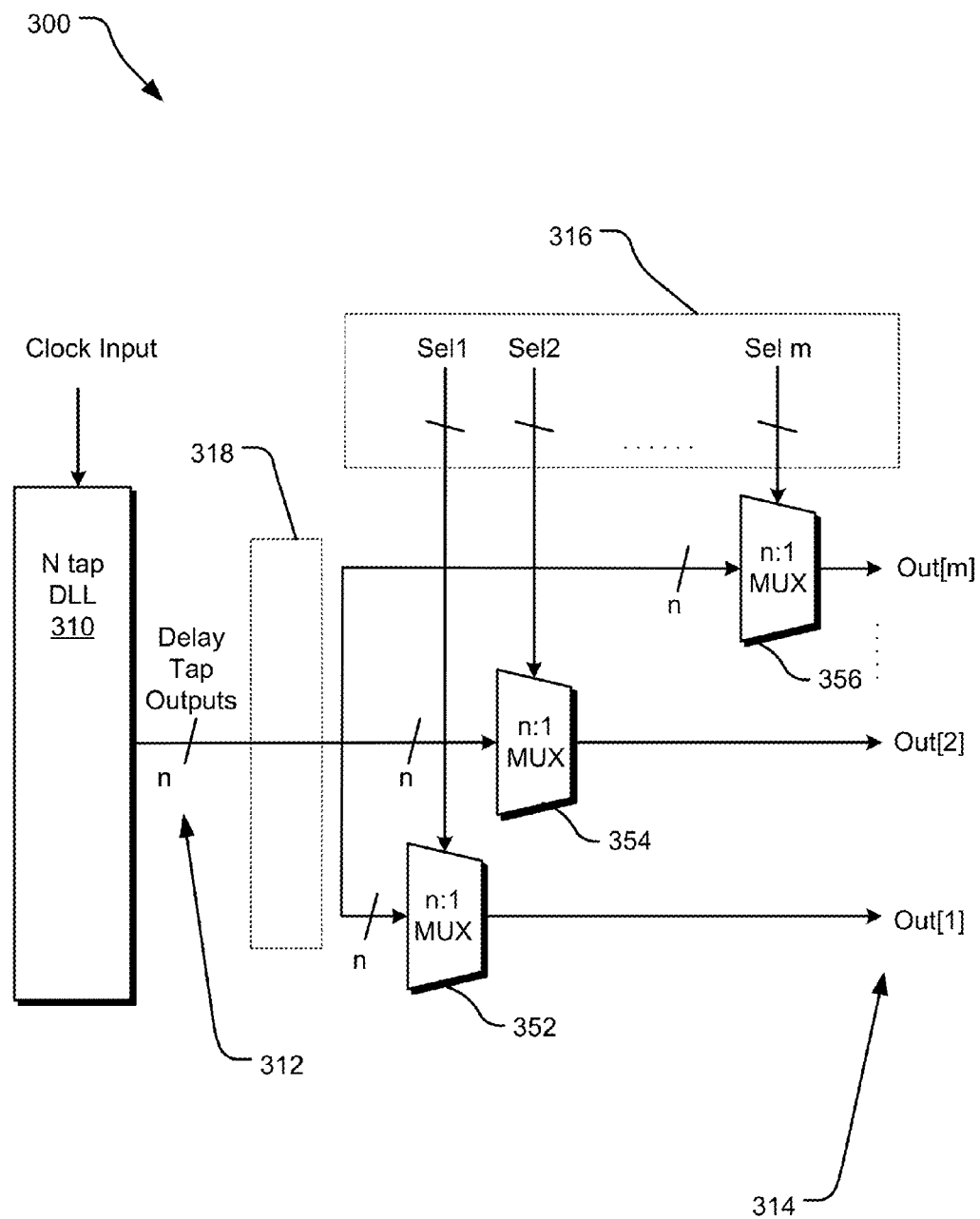
FIG. 3 illustrates an example implementation of the clocking system disclosed herein as used with multiple delay taps assigned to multiple outputs.

FIG. 3 illustrates an example use implementation of a scalable clocking system 300 as used with multiple delay taps assigned to multiple outputs. Specifically, the scalable clocking system 300 is implemented using an n-tap DLL circuit 310 that generates clock output signals at n delay taps 312. The scalable clocking system 300 allows for each of the n delay taps 312 to be assigned to any of M outputs 314. Therefore, the scalable clocking system 300 can be used to generate multiple clock outputs that have a controlled phase relationship to each other.

An implementation of the scalable clocking system 300 ensures that the phase of the M outputs 314 changes in a monotonic phase with each increment in the phase selection input code across all M outputs 314. Specifically, output on the delay taps 312 is buffered using selectable buffers 318 such that output on all taps is available for potential use across all n:1 multiplexers 352-356 as determined by a selection logic 316. Furthermore, any delay through the selectable buffers 318 is to be minimized in order that its variation is small compared to the incremental delay in the delay line of the n-tap DLL circuit 310 to ensure that the selected incremental M output 314 is monotonic with the delay selection input code as per the selection logic 316.

Figure 4:
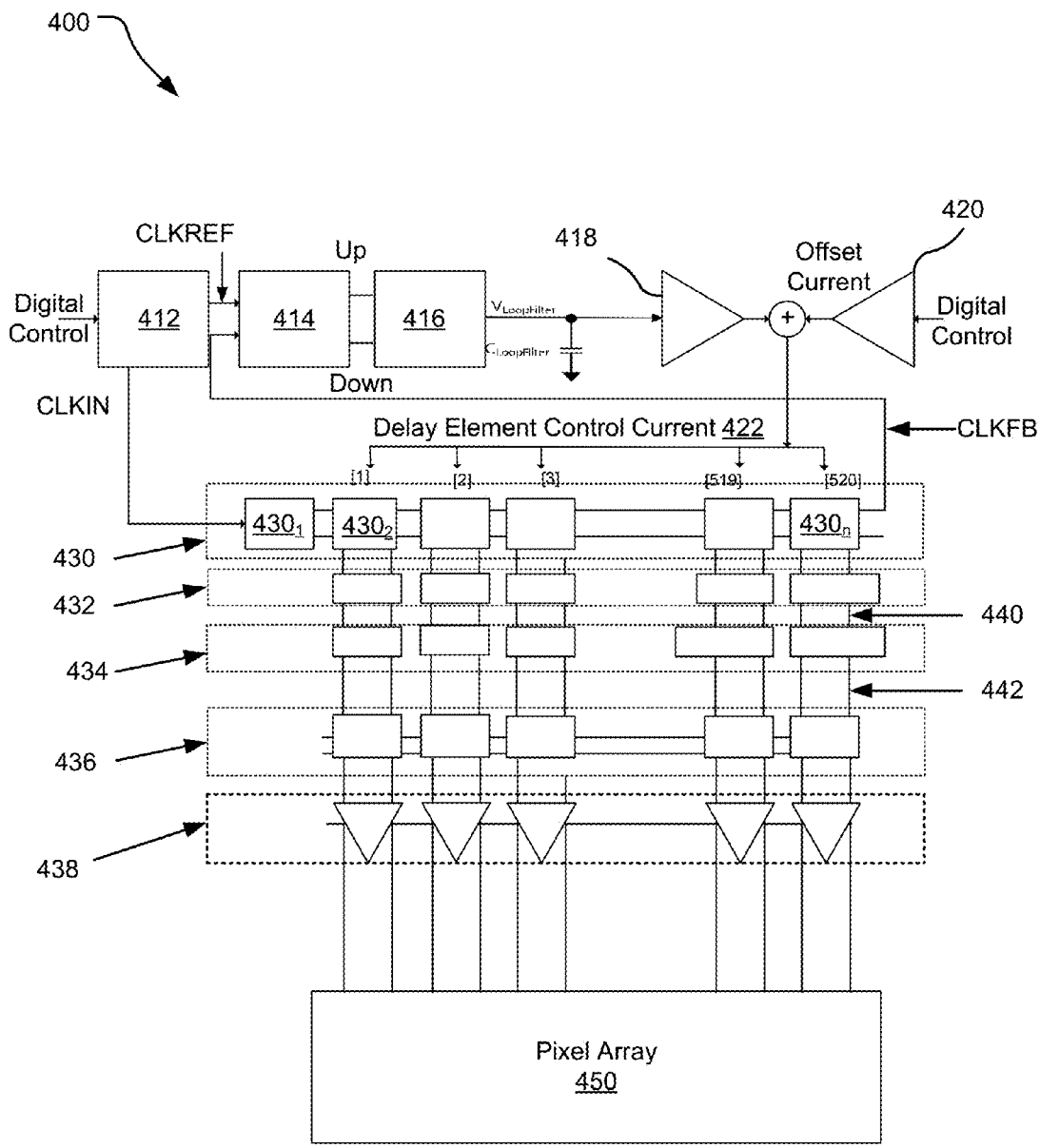
FIG. 4 illustrates another example implementation of the clocking system disclosed herein.

FIG. 4 illustrates another example implementation of the clocking system 400 disclosed herein. The clocking system 400 includes a clock waveform generator 412 that generates a clock reference signal (CLKREF) and a clock-in signal (CLKIN). The clock reference signal may be a reference signal with a delay of 10 ns from the clock-in signal and it may be used as a reference signal by various other components of the clocking system 400. The clock-in signal is fed to a delay line 430 of a DLL circuit.

In the illustrated implementation, the clock reference signal CLKREF is input to a phase detector 414 that works with a charge pump 416 to detect phase errors in the clockfeedback signal, CLKFB. The output of the charge pump 416 is then integrated onto the loop filter capacitor and hence producing an error voltage that is converted by a voltage/current converter 418 into an error current. The error current is combined with current from a current digital-to-analog converter (DAC) 420 to generate delay element control currents 422 that is used to control delay elements of the delay line 430.

In one implementation, the delay line 430 includes a delay line with n delay combinations $430_1 \ldots 430_n$ with each combination including delay elements and feed-forward components. The delay elements may be inverters implemented using transistors. Each of the delay elements of the delay combinations $430_1 \ldots 430_n$ produces an output waveform that is similar to the input waveform delayed by a certain amount of time. The amount of delay for each delay element is controlled by the delay element control current 422. Furthermore, successive delay elements create a phase A and a phase B signal that is substantially 180 degrees out of phase. The feed-forward components of the delay combinations $430_1 \ldots 430_n$ are configured to increase the speed of the clock signal transmission through the delay elements and to enforce symmetric zero crossings of the clock signal at each of the plurality of delay elements. In one implementation, the delay combinations $430_1 \ldots 430_n$ operate in a low-voltage domain.

The output of the delay line 430 is input to a series of level shifters 432 that shifts the low voltage domain output of the delay line 430 into high voltage domain, if required, that is appropriate for use with a series of interpolators 434. The series of level shifters 432 may be referred to as tap points as they allow for voltage domain separation between primary tap points 440 and secondary tap points 442.

The interpolators 434 are configured to space each of the delayed clock output signals at the primary tap points 440 to generate a plurality of clock signals substantially equidistance from each other at the plurality of secondary tap points 442. Specifically, the interpolators 434 may interpolate output from each delay element on the successive A phase progression with itself, which allows to preserve equal loading. Each delay element on the successive B phase progression may be interpolated in the following way: B[n] interpolated with B[n+1] so to position the edge exactly centered in-between B[n] and B[n+1]. In one implementation, the interpolators 434 are configured so as to generate output clock signals that are at substantially 10 ps from each other the secondary tap points 442.

The interpolated output clock signals at the secondary tap points 442 are fed to parking elements 436 such as buffers. The output of the parking elements 436 may be used to drive an array of drivers 438. For example, the array of drivers 438 may be an array of pixel drivers that drive a pixel array 450 of a ToF system.

Figure 5:
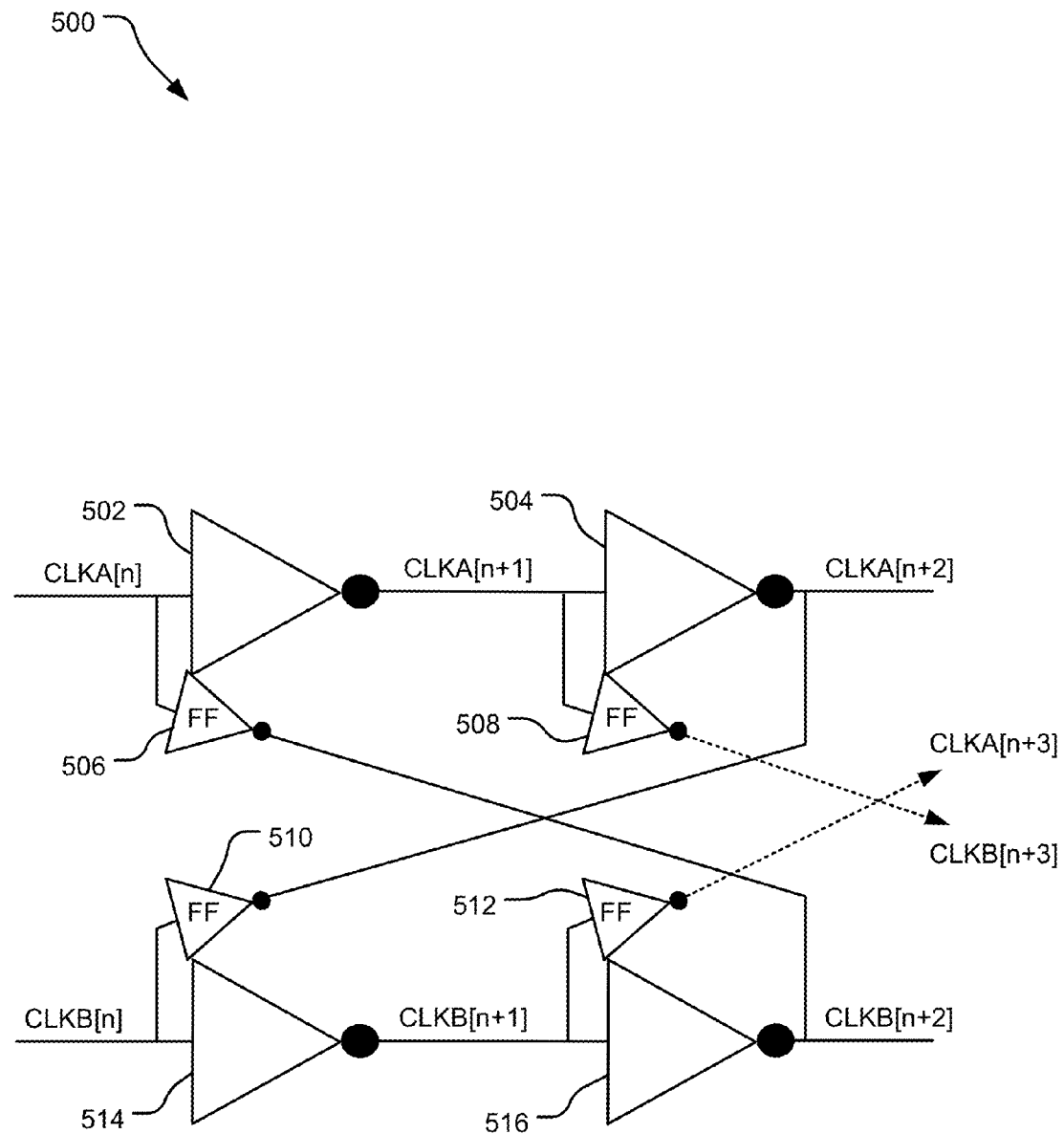
FIG. 5 illustrates an example implementation of a feed-forward component used with delay components of the clocking system disclosed herein.

FIG. 5 illustrates an example implementation of a double-delay element 500 of the clocking system disclosed herein. The double-delay element 500 includes delay components 502, 504, 514, 516 together with feed-forward components 506, 508, 510, 512. An input signal CLKA[n] to the delay component 502 is fed forward using the feed-forward component 506 to CLKB[n+2] and an input signal CLKB[n] to the delay component 514 is fed forward using the feed-forward component 510 to CLKA[n+2]. Similarly, an input signal CLKA[n+1] to the delay component 504 is fed forward using the feed-forward component 508 to CLKB[n+3] and an input signal CLKB[n+1] to the delay component 516 is fed forward using the feed-forward component 512 to CLKA[n+3]. The double-delay element 500 enforces zero-crossing of the signal on each of the A and B signals on a DLL core implemented using a series of double delay components similar to the double-delay element 500.

Figure 6:
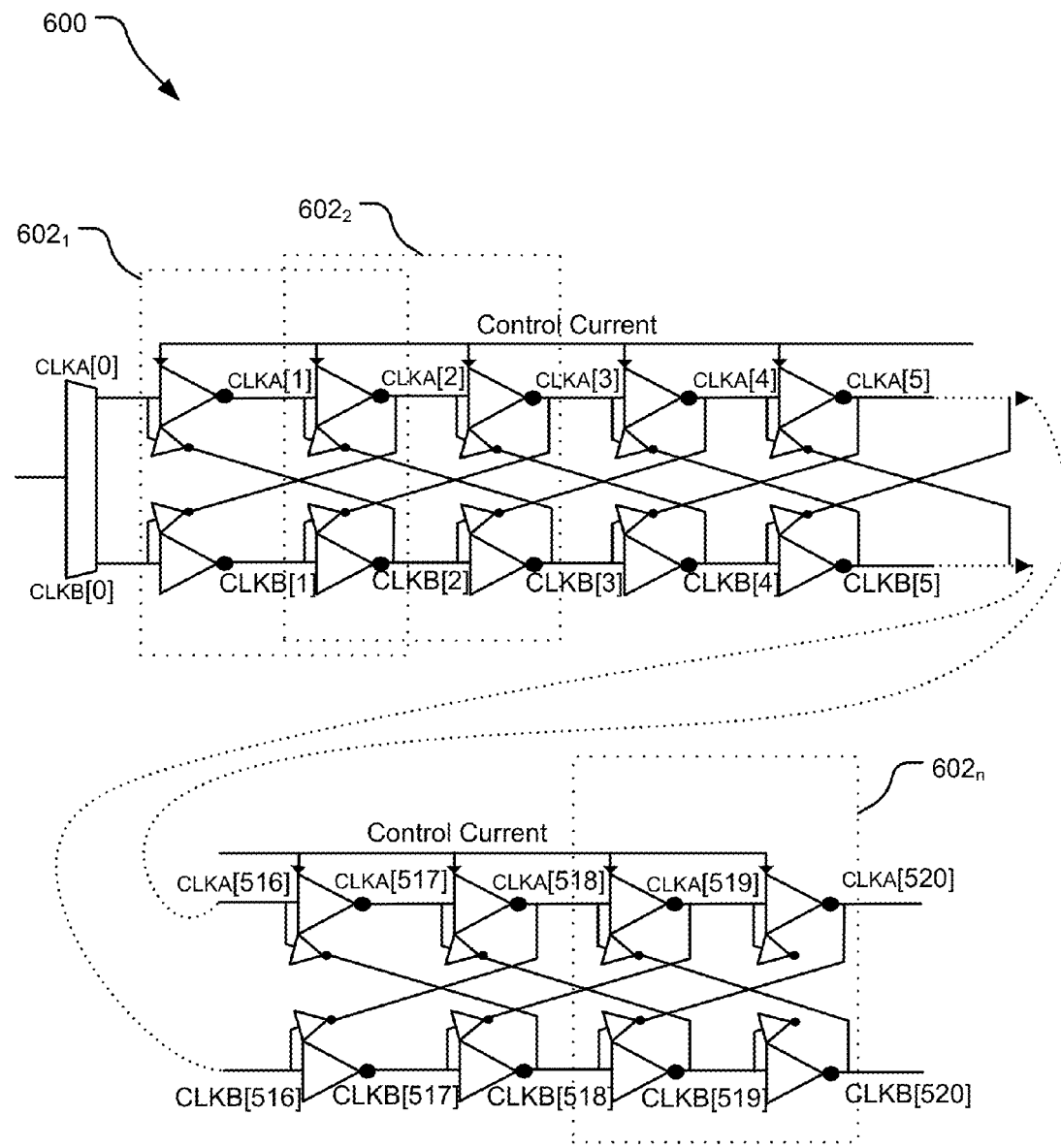
FIG. 6 illustrates an example implementation of a feed-forward system used with a delay line of the clocking system disclosed herein.

FIG. 6 illustrates an example implementation of a DLL core 600 implemented using delay elements and feed-forward components arranged in series of double delay elements $602_1, 602_2, \ldots 602_n$. While in the illustrated implementation, the DLL core has 520 delay elements, in alternative implementations, other combinations of delay elements may also be provided.

Figure 7:
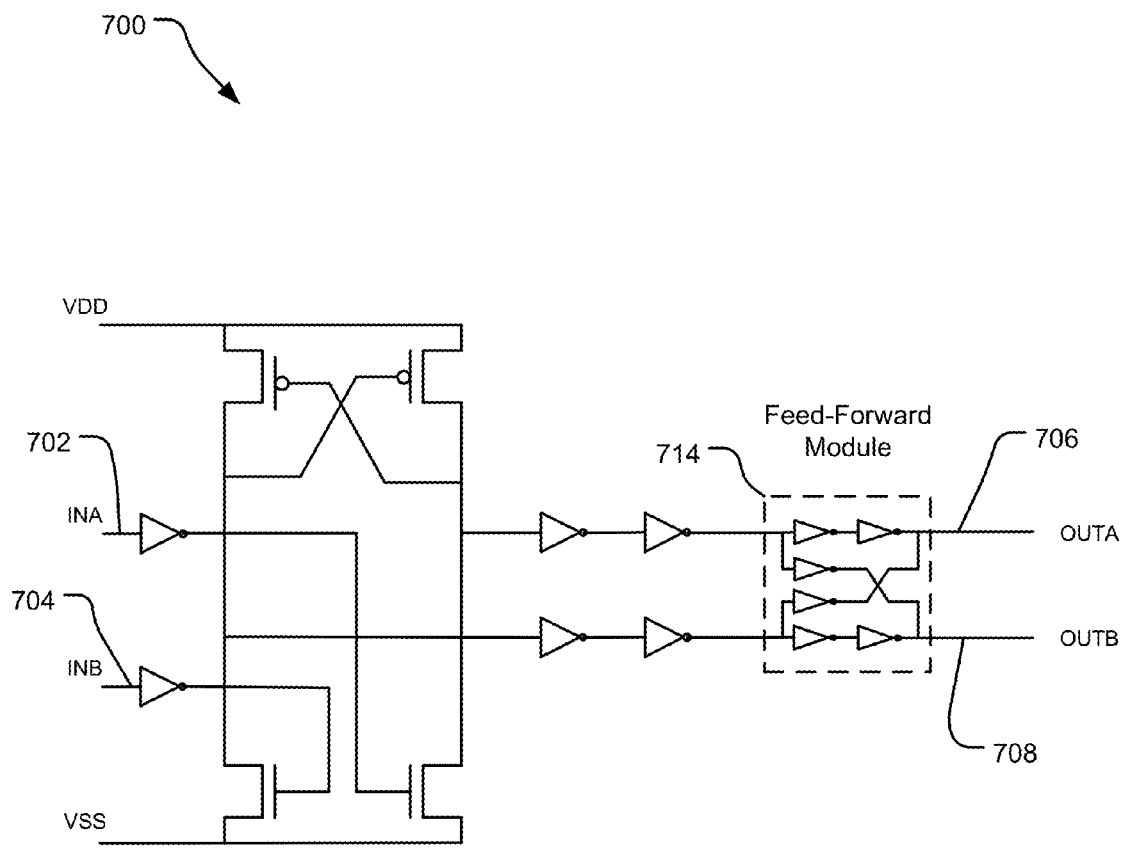
FIG. 7 illustrates an implementation of level-shifters technology used by the clocking system disclosed herein.

FIG. 7 illustrates an implementation of level-shifters module 700 used by the clocking system disclosed herein. Specifically, the level shifter module 700 receives inputs INA 702 and INB 704 in a low voltage domain and generates outputs OUTA 706 and OUTB 708 in a high voltage domain. The level shifter module 700 also includes a feed-forward module 714.

Figure 8:
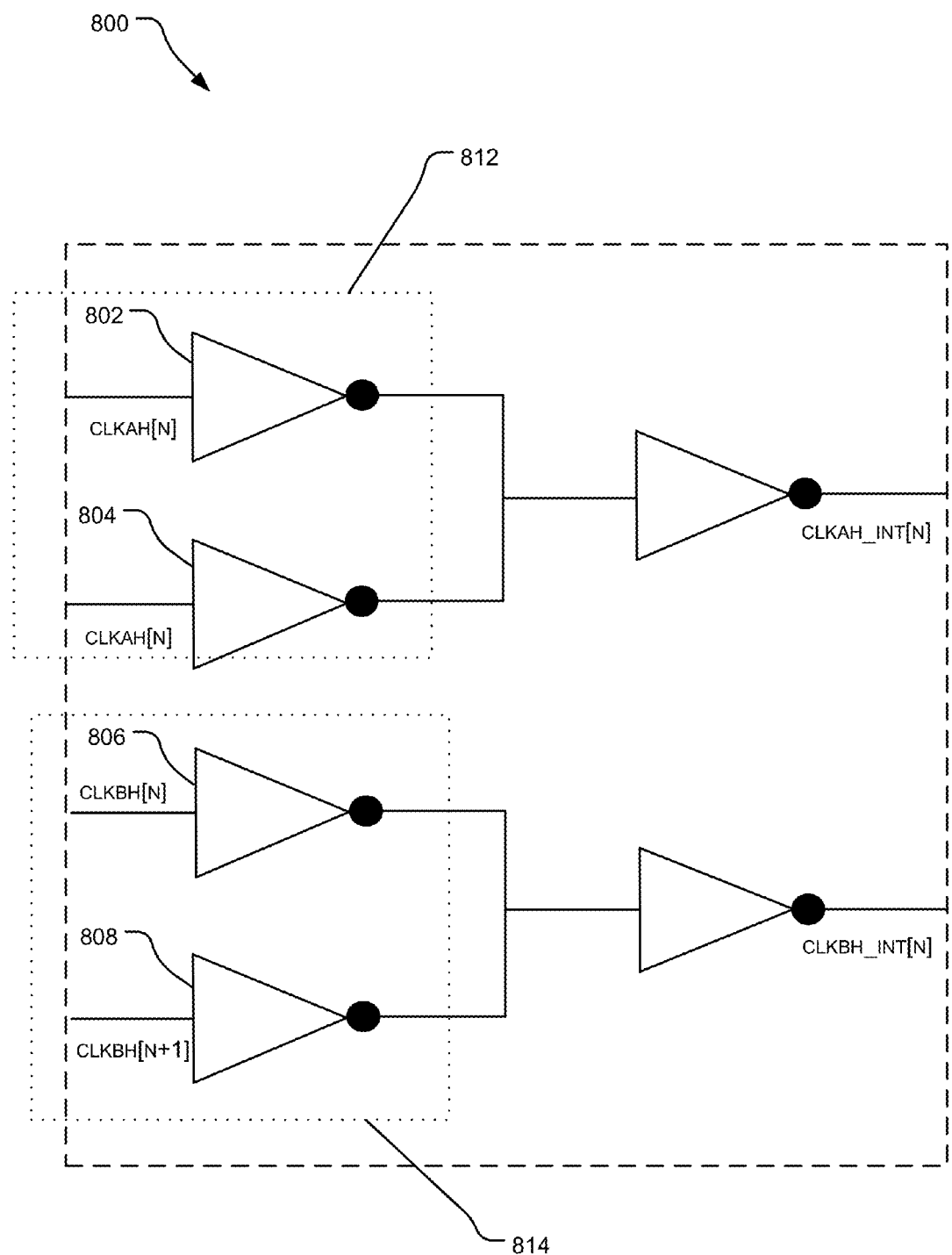
FIG. 8 illustrates an implementation of an interpolator used by the clocking system disclosed herein.

FIG. 8 illustrates an implementation of an interpolator 800 used by the clocking system disclosed herein. The interpolator 800 is configured to receive input from the level shifters at primary tap points and generate output at the secondary tap points. Specifically, the interpolator 800 includes an A phase module 812 including delay elements 802 and 804, where the A phase module interpolates onto itself. The interpolator 800 also includes a B phase module 814 including delay elements 806 and 808, where the B phase module interpolates between two phases. The interpolator 800 may be connected to a primary tap point and is configured to space each of the delayed clock output signals at the primary tap point to generate a plurality of clock signals substantially equidistance from each other at a plurality of secondary tap points, which allows for equal delay and loading for interpolated and non-interpolated phases.

Figure 9:
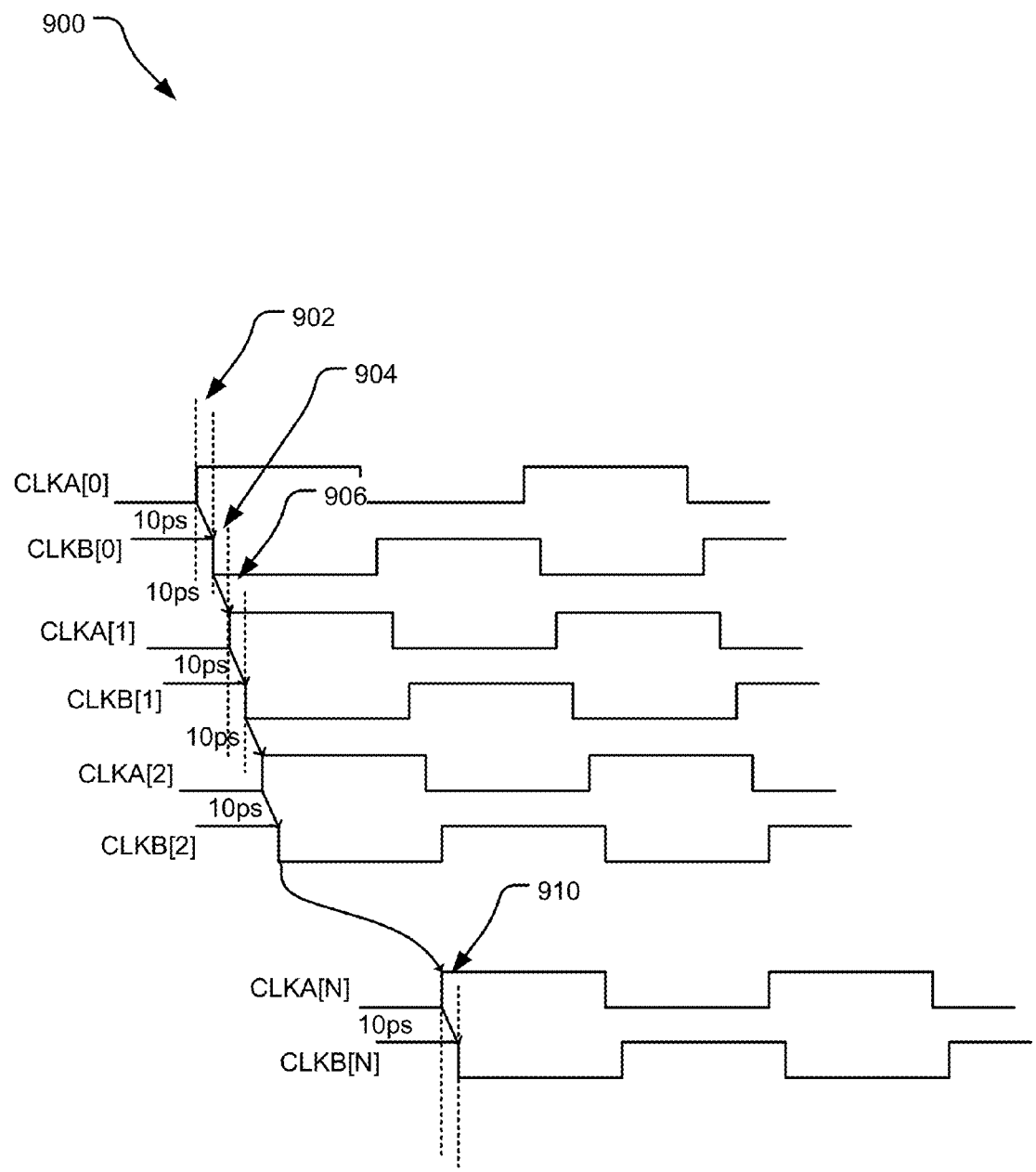
FIG. 9 illustrates example interpolated waveforms generated by the clocking system disclosed herein.

FIG. 9 illustrates example interpolated waveforms 900 generated by the clocking system disclosed herein. Specifically, the waveforms are illustrated at the output of the interpolators that enforce a plurality of clock signals substantially equidistance from each other at a plurality of secondary tap points, which allows for equal delay and loading for interpolated and non-interpolated phases. Specifically, as shown, the waveforms are spaced equidistance from each other as disclosed by the distances 902, 904, 906, . . . , 910. In one implementations the distances 902, 904, 906, . . . , 910 are substantially equal to 10 ps.

Figure 10:
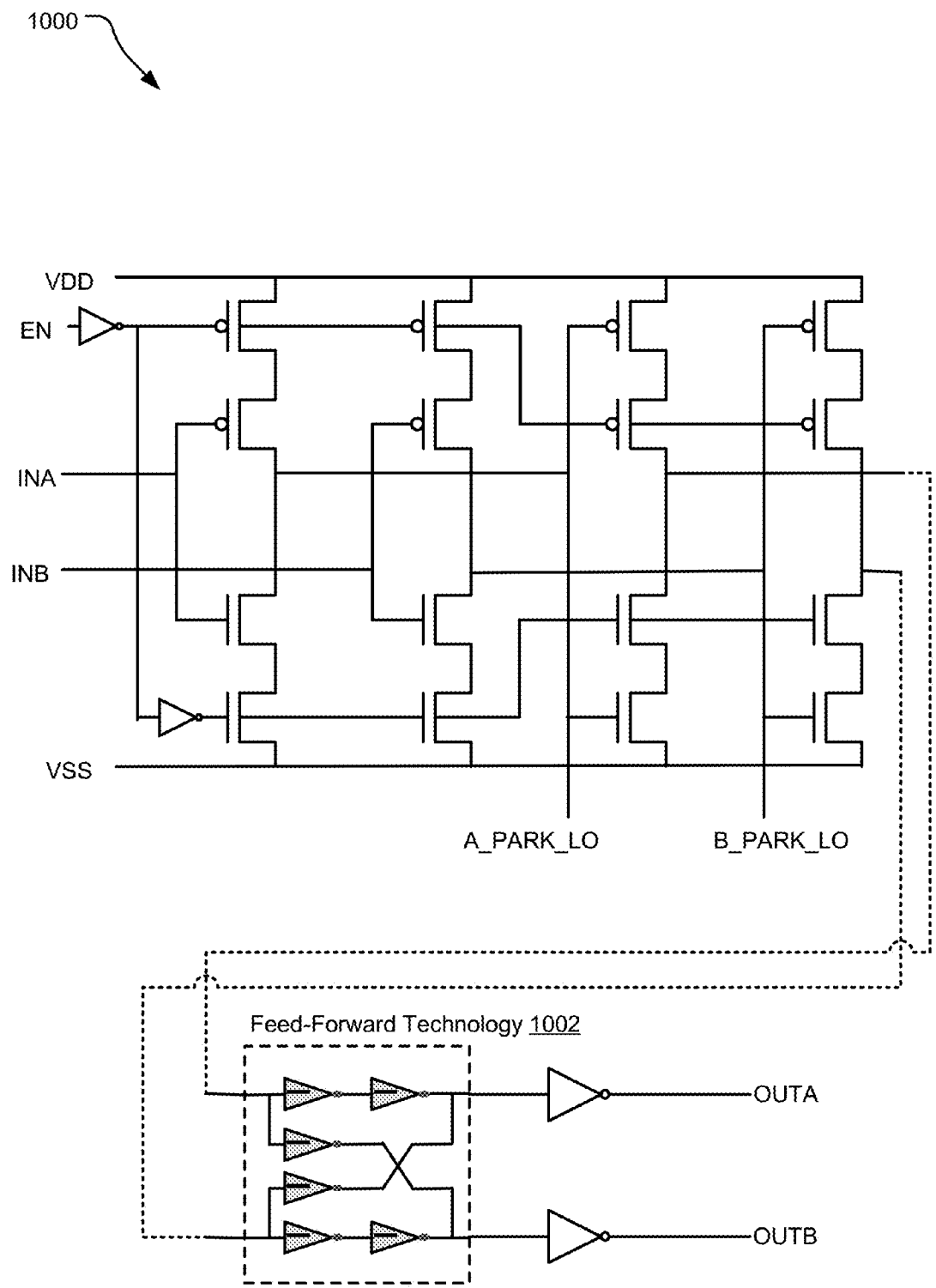
FIG. 10 illustrates an example implementation of a buffer used by the clocking system disclosed herein.

FIG. 10 illustrates an example implementation of a buffer 1000 used by the clocking system disclosed herein. The buffer 1000 receives inputs INA and INB and drives the pixel array from OUTA and OUTB. In one implementation, the buffer 1000 also includes a feed-forward module 1002. The feed-forward module 1002 speeds up and enforces the symmetry of the zero-crossing.

Figure 11:
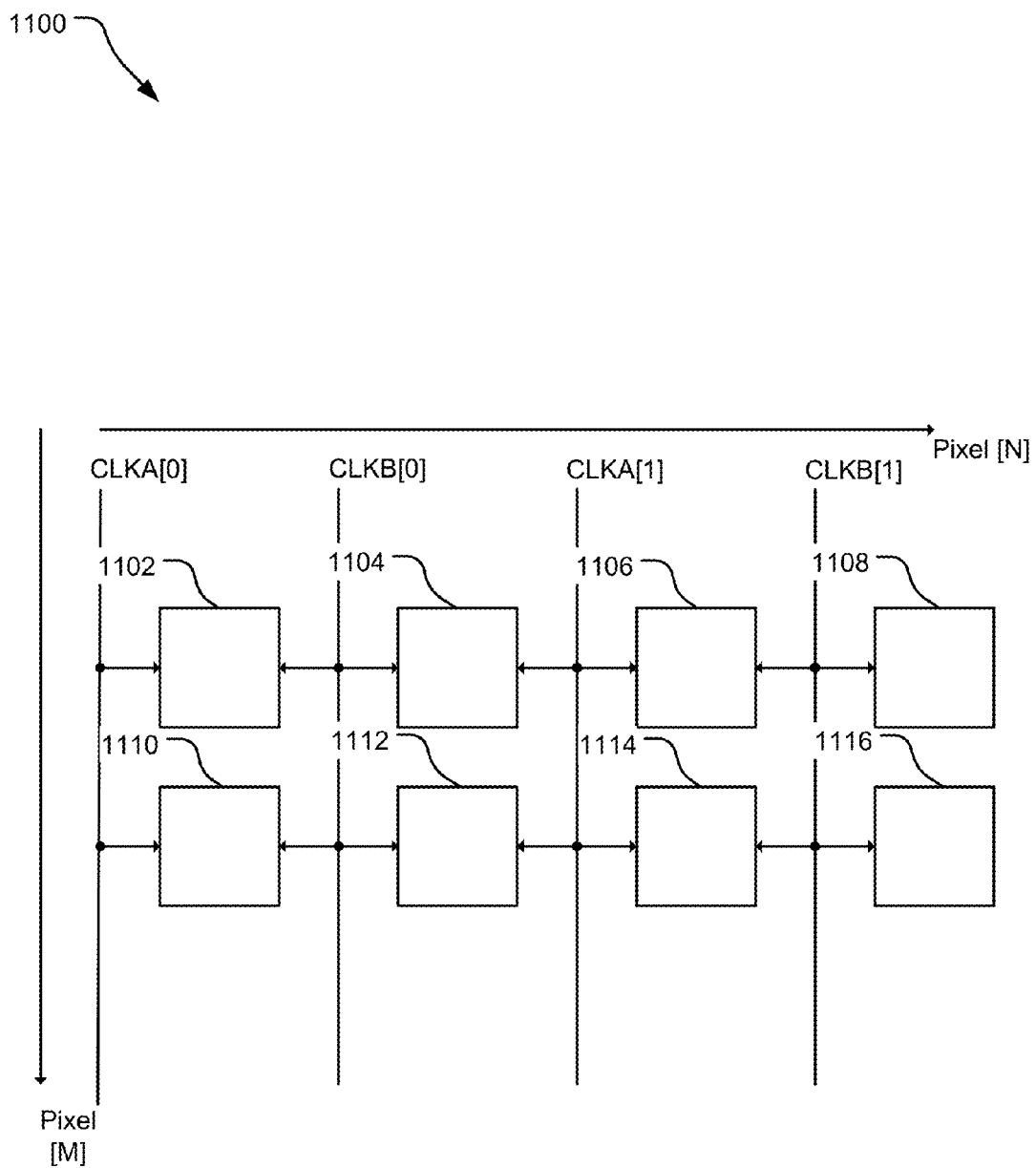
FIG. 11 illustrates an implementation of a pixel array being driven by the clocking system disclosed herein.

FIG. 11 illustrates an implementation of a pixel array 1100 being driven by the clocking system disclosed herein. For example, each column of the pixel array 1100 may be driven by a clock signal. Thus, for example, pixels 1102, 1110 are driven by clock signal CLKA[0], pixels 1104, 1112 are driven by clock signal CLKB[0], etc. The pixel drivers may receive their input signals from the buffers storing interpolated signals. Specifically, each of the signals CLKA[0], CLKB[0], CLKA[1], CLLB[1] may be equidistant from each other to result in accurate timings for the sampling of the pixels 1102-1116.

A clocking system comprises a delay locked loop (DLL) circuit with a plurality of delay elements, the DLL circuit configured to receive a clock input signal and generate a plurality of clock output signals and a feed-forward system configured to increase the speed of a clock signal transmission through the delay elements and to enforce symmetric zero crossings of the clock signal at each of the plurality of delay elements. In one implementation, the DLL circuit and the feed-forward system are configured to operate in a low voltage domain. Alternatively, the plurality of clock output signals are input to a plurality of level shifters to generate level shifted output signal at a plurality of primary tap points.

In an alternative implementation, the clocking system further includes a plurality of interpolators, each of the plurality of interpolators connected to one of a plurality of primary tap points, wherein each of the plurality of interpolators is configured to space each of the delayed clock output signals at the primary tap points to generate a plurality of clock signals substantially equidistance from each other at a plurality of secondary tap points. Alternatively, each of the plurality of interpolators is configured to generate the plurality of clock signals at substantially 10 ps from each other at the plurality of secondary tap points. Yet alternatively, each of the secondary tap points is configured to be connected to one of a plurality of output buffer transistors (QBUF), wherein each of the QBUF transistors provides voltage output levels configured for input to one of a plurality of tap drivers.

In an alternative implementation, each of the plurality of tap drivers is configured to drive a pixel driver of a sensor of a Time-of-Flight system. Yet alternatively, each of the plurality of tap drivers is configured to drive a multiplexer of a multiplexer bus. Alternatively, successive delay elements of the DLL circuit generates a phase A and a phase B signal that are substantially 180 degrees out of phase. Yet alternatively, each delay element on successive A phase progression is interpolated with itself, whereas each delay element of successive B phase progression is interpolated such that B[n] is interpolated with B[n+1]. Alternatively, the clocking system includes a plurality of level shift circuits, each of the plurality of level shift circuits shifting an output at a primary tap point from a low voltage to a high voltage level required by one of the plurality of interpolators at a secondary tap point.

A scalable DLL clocking system includes a delay locked loop (DLL) circuit with a plurality of delay elements, the DLL circuit configured to receive a clock input signal and generate a plurality of clock output signals, a feed-forward system configured to increase the speed of the clock signal transmission through the delay elements and to enforce symmetric zero crossings of the clock signal at each of the plurality of delay elements, and a plurality of interpolators, wherein each of the plurality of interpolators is configured to space each of the delayed clock output signals to generate a plurality of clock signals substantially equidistance from each other.

In one implementation, the DLL circuit and the feed-forward system are configured to operate in a low voltage domain. Alternatively, the plurality of clock output signals are input to a plurality of level shifters to generate a level shifted output signal at a plurality of primary tap points. Yet alternatively, each of the plurality of interpolators is configured to generate the plurality of clock signals at substantially 10 ps from each other at the plurality of secondary tap points. Alternatively, successive delay elements of the DLL circuit generates a phase A and a phase B signal that are substantially 180 degrees out of phase.

A system includes a delay locked loop (DLL) circuit with a plurality of delay elements, the DLL circuit configured to receive a clock input signal and generate a plurality of combinations of phase A signals and phase B signals and a feed-forward system configured to increase the speed of the plurality of combinations of phase A signals and phase B signals through the delay elements. Alternatively, the feed-forward system is further configured to enforce symmetric zero crossings of the clock input signal at each of the plurality of delay elements wherein the DLL circuit.

An implementation further includes, a plurality of interpolators, each of the plurality of interpolators configured to space the phase A signal and the phase B signal of each combination substantially equidistance from each other at a plurality of secondary tap points. An implementation further includes a plurality of level shift circuits, each of the plurality of level shift circuit shifting a combination of outputs from the DLL to a voltage level required by one of the plurality of interpolators.

The above specification, examples, and data provide a description of the structure and use of exemplary embodiments of the disclosed subject matter. Since many implementations can be made without departing from the spirit and scope of the disclosed subject matter, the claims hereinafter appended establish the scope of the subject matter covered by this document. Furthermore, structural features of the different embodiments may be combined in yet another implementation without departing from the recited claims.

What is claimed is:

1. A clocking system, comprising:
    a delay locked loop (DLL) circuit with a plurality of delay elements, the DLL circuit configured to receive a clock input signal and generate a plurality of clock output signals; and
    a feed-forward system configured to increase the speed of a clock signal transmission through the delay elements and to enforce symmetric zero crossings of the clock signal at each of the plurality of delay elements.

2. The clocking system of claim 1, wherein the DLL circuit and the feed-forward system are configured to operate in a low voltage domain.

3. The clocking system of claim 1, wherein the plurality of clock output signals are input to a plurality of level shifters to generate level shifted output signals at a plurality of primary tap points.

4. The clocking system of claim 1, further comprising a plurality of interpolators, each of the plurality of interpolators connected to one of a plurality of primary tap points, wherein each of the plurality of interpolators is configured to space each of the delayed clock output signals at the primary tap points to generate a plurality of clock signals substantially equidistance from each other at a plurality of secondary tap points.

5. The clocking system of claim 4, wherein the each of the plurality of interpolators is configured to generate the plurality of clock signals at substantially 10 ps from each other at the plurality of secondary tap points.

6. The clocking system of claim 5, wherein each of the secondary tap points is configured to be connected to one of a plurality of output buffer transistors (QBUF), wherein each of the QBUF transistors provides voltage output levels configured for input to one of a plurality of tap drivers.

7. The clocking system of claim 6, wherein each of the plurality of tap drivers is configured to drive a pixel driver of a sensor of a Time-of-Flight system.

8. The clocking system of claim 6, wherein each of the plurality of tap drivers is configured to drive a multiplexer of a multiplexer bus.

9. The clocking system of claim 1, wherein successive delay elements of the DLL circuit generates a phase A and a phase B signal that are substantially 180 degrees out of phase.

10. The clocking system of claim 9, wherein each delay element on successive A phase progression is interpolated with itself, whereas each delay element of successive B phase progression is interpolated such that B[n] is interpolated with B[n+1].

11. The system of claim 4 further comprising a plurality of level shift circuits, each of the plurality of level shift circuits shifting an output at a primary tap point from a low voltage to a high voltage level required by one of the plurality of interpolators at a secondary tap point.

12. A scalable DLL clocking system, comprising:
a delay locked loop (DLL) circuit with a plurality of delay elements, the DLL circuit configured to receive a clock input signal and generate a plurality of clock output signals;
a feed-forward system configured to increase the speed of the clock signal transmission through the delay elements and to enforce symmetric zero crossings of the clock signal at each of the plurality of delay elements; and
a plurality of interpolators, wherein each of the plurality of interpolators is configured to space each of the delayed clock output signals to generate a plurality of clock signals substantially equidistance from each other.

13. The scalable DLL clocking system of claim 12, wherein the DLL circuit and the feed-forward system are configured to operate in a low voltage domain.

14. The scalable DLL clocking system of claim 12, wherein the plurality of clock output signals are input to a plurality of level shifters to generate a level shifted output signal at a plurality of primary tap points.

15. The scalable DLL clocking system of claim 12, wherein the each of the plurality of interpolators is configured to generate the plurality of clock signals at substantially 10 ps from each other at the plurality of secondary tap points.

16. The scalable DLL clocking system of claim 12, wherein successive delay elements of the DLL circuit generates a phase A and a phase B signal that are substantially 180 degrees out of phase.

17. A system, comprising:
a delay locked loop (DLL) circuit with a plurality of delay elements, the DLL circuit configured to receive a clock input signal and generate a plurality of combinations of phase A signals and phase B signals; and
a feed-forward system configured to increase the speed of the plurality of combinations of phase A signals and phase B signals through the delay elements.

18. The system of claim 17, wherein the feed-forward system is further configured to enforce symmetric zero crossings of the clock input signal at each of the plurality of delay elements wherein the DLL circuit.

19. The system of claim 17, further comprising a plurality of interpolators, each of the plurality of interpolators configured to space the phase A signal and the phase B signal of each combination substantially equidistance from each other at a plurality of secondary tap points.

20. The system of claim 19, further comprising a plurality of level shift circuits, each of the plurality of level shift circuit shifting a combination of outputs from the DLL to a voltage level required by one of the plurality of interpolators.

* * * * *